March 5, 1957 A. L. HOPPER 2,784,377

MICROWAVE DEVICE

Filed Jan. 30, 1952 2 Sheets-Sheet 1

INVENTOR
A. L. HOPPER

BY Hugh S. Wertz
ATTORNEY

March 5, 1957 A. L. HOPPER 2,784,377
MICROWAVE DEVICE
Filed Jan. 30, 1952
2 Sheets-Sheet 2
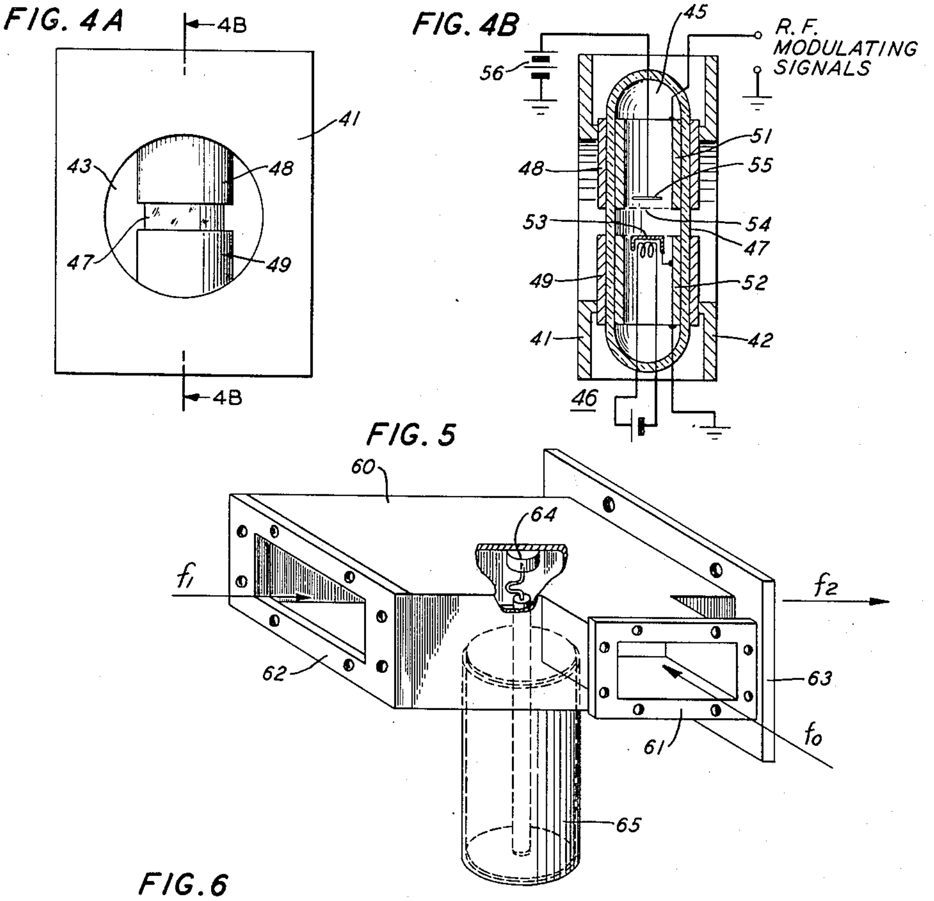
FIG. 4A, FIG. 4B, FIG. 5
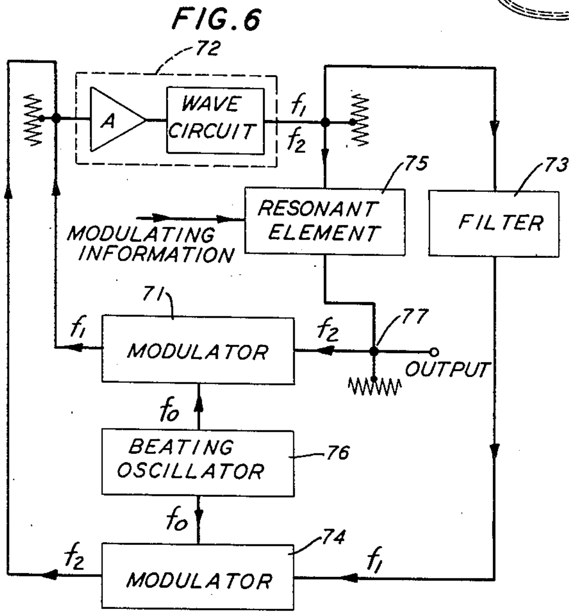
INVENTOR
A. L. HOPPER
BY Hugh S. Wertz
ATTORNEY United States Patent Office 2,784,377 Patented Mar. 5, 1957

2,784,377

MICROWAVE DEVICE

Andrew L. Hopper, Summit, N. J., assignor to Bell Telephone Laboratories, Incorporated, New York, N. Y., a corporation of New York Application January 30, 1952, Serial No. 268,979

11 Claims. (Cl. 332—23)

The present invention relates to microwave apparatus and more specifically, to microwave oscillators and components therefor. In one of its more important aspects, the invention relates to microwave oscillators which are characterized by oscillatory loops having long electrical lengths and components therefor such as those which include traveling wave amplifiers in which traveling waves interact with electron streams along large numbers of wavelengths to secure gain.

The development of broad band amplifiers has created a corollary need for broad band frequency modulated oscillators for use therewith. It is convenient to adapt wide band devices such as traveling wave amplifiers for use in such oscillators. Frequency modulated or swept oscillators which utilize traveling wave amplifiers have been known hitherto, but in such devices it has generally been necessary to insert phase shifting elements in the oscillatory loop to compensate for the varying electrical length (i. e. number of wavelengths at the operating frequency) of the traveling wave amplifier as the operating frequency is modulated. However, for wide band frequency modulation, the high requirements imposed on the phase shifting elements create serious practical problems. For example, suppose it is required to provide a 500 megacycle excursion around a 4000 megacycle center frequency with a traveling wave amplifier having 40 wavelengths delay at mid-frequency. This delay will then vary between 42.5 and 37.5 wavelengths at 4250 and 3750 megacycles, respectively, representing a total variation of five wavelengths, or 1800 degrees. It has been a difficult practical problem to provide compensating delays conveniently with orthodox phase shifting techniques.

Accordingly, it is an object of the invention to compensate more conveniently than has hitherto been possible for the large phase shifts in oscillatory loops of frequency modulated oscillators of the kind described and in general to improve such frequency modulated oscillators.

In accordance with the invention, the electrical length of the oscillatory loop in a frequency modulated or swept oscillator is maintained substantially constant despite modulation of the operating frequency. To this end, the oscillatory loop comprises two sections, each electrically long, one for traversal by a wave of a first operating frequency, and the other for traversal by a wave whose operating frequency varies oppositely with modulations of the first operating frequency. In an illustrative embodiment of the invention, two traveling wave amplifiers operate in series in the oscillatory loop at two different frequencies. By means of two modulators and a common beating oscillator, the two frequencies deviate equally in opposite directions in response to modulations introduced by way of a variable resonant element. Since the phase shift in each amplifier is linearly related to its particular operating frequency, the sum of the two, which is a measure of the electrical length of the oscillatory loop, can therefore be kept constant. The phase shift around the oscillatory loop can be adjusted initially to provide the necessary phase relations for sustained oscillations and hence this condition will persist. Either of the two frequencies can be derived from the loop as the useful output.

The invention will be better understood from the following more detailed description taken in connection with the accompanying drawings in which:

Figs. 1 and 6 are schematic representations of illustrative embodiments of the invention;

Figs. 4A and 4B show a resonant element suitable for incorporation in the embodiments of Figs. 1 and 6 for radio frequency modulating signals; and Fig. 5 shows a modulator suitable for incorporation in the embodiments of Figs. 1 and 6.

Figure 1:
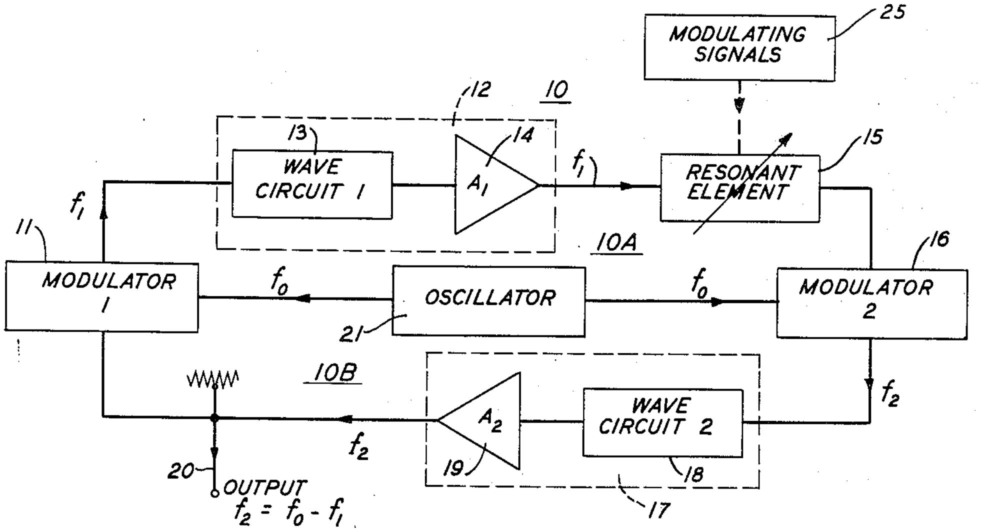

With reference now more particularly to the drawings, Fig. 1 shows schematically as an illustrative embodiment of the invention, a traveling wave type frequency modulated oscillator 10. The oscillatory loop comprises two sections. The first section 10A includes the frequency converter or modulator 11, the traveling wave amplifier 12 which for purposes of analysis is represented by the combination of an electrically long wave circuit 13 whose total phase shift or electrical length varies with frequency and the amplifying element 14 whose phase shift is independent of frequency, and a variable resonant element 15 under control of the modulating signal information. The second section 10B includes the frequency converter or modulator 16, the traveling wave amplifier 17, represented as above by the combination of an electrically long wave circuit 18 and the amplifying element 19, and the hybrid junction 20 from one branch of which is taken the output to be utilized. Each of the modulators 11 and 15 is supplied also from an oscillator 21 which operates at a fixed frequency and amplitude.

The two sections operate at different oppositely varying frequencies. For example, the first operates at a frequency $f_1$ where this frequency is the resonant frequency of the varying resonant element 15 and, accordingly, changes in accordance with the modulating information, and the second operates at a frequency $f_2$ where this frequency is the difference between the fixed frequency $f_0$ characteristic of the oscillator 21 and the frequency $f_1$. It can be seen, therefore, that the spectrums of the two sections will be reversed relative to one another. For example, as the operating frequency $f_1$ is increased as the resonant frequency of the variable element 15 is changed by the modulating information, the second frequency $f_2$ is correspondingly reduced. This relationship between the two frequencies requires that the two sections have electrical length-vs.-frequency characteristics such that, with changes in the oscillatory frequency, increases in length in one section are matched by decreases in length of the other section. In the case where the wave circuits 13 and 18 are each the transmission paths of identical traveling wave tubes, this condition will generally be satisfied since such tubes are usually characterized by linear electrical length-vs.-frequency characteristics over the operating range. Hence in the oscillator 10, the phase shift around the oscillatory loop will remain constant although the operating frequencies $f_1$ and $f_2$ vary.

Figure 2A:
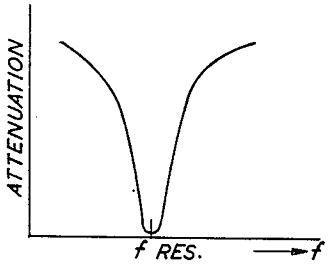
Figs. 2A and 2B are resonant element characteristics.
Figure 2B:
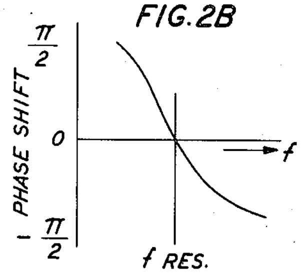

In a closed loop of the type formed by the two sections 10A and 10B, the condition for oscillation is that the plot in polar coordinates of the complex product $\mu\beta$ pass through the point 1,0 where $\mu$ is the complex forward amplification factor and $\beta$ the complex feedback factor. Accordingly, for operation the electrical length of the loop is adjusted initially to provide zero phase departure therearound over the range of operating frequencies, and oscillations, building up from noise at the start, occur at the frequency at which the phase departure is zero provided the loop gain there initially exceeds unity. A frequency selective element or network, as for example the resonant element 15, whose characteristics can be modulated by the signal information, and which is here shown arbitrarily associated with the first loop, serves as the frequency control. Since the loop apart from this frequency selective element has been adjusted for approximately zero phase departure, oscillations occur at the frequency for which the phase shift of the element is approximately zero provided that the loop gain is sufficient. In the case of conventional resonant elements, when the phase shift is zero, then the attenuation is also a minimum. For example in Figs. 2A and 2B, there are plotted attenuation and phase shift vs. frequency characteristics, respectively, of a typical resonant element. It can be seen that at the resonant frequency the phase shift is zero and the attenuation is at a minimum. Accordingly, both these factors contribute to stability at a frequency for which the element 15 is approximately at resonance.

Either of the two modulated frequencies, $f_1$ or $f_2$, can serve as the useful output and the amplitude of the chosen output can be limited by making each modulator output dependent principally on the amplitude of the beating oscillator 21, which remains fixed. Alternatively, the amplitude can be controlled by a suitable form of automatic volume control or compression in ways familiar to the workers in the electronics art. The useful output can, for example, be derived from one branch of a suitable hybrid junction inserted in either section of the oscillatory loop, the choice being dependent on whether a signal of frequency $f_1$ or $f_2$ is preferred as output.

In general, it is of course advantageous to include frequency selective elements in each section of the closed loop to suppress undesirable modulation products. In Fig. 1, these have not been shown specifically, it being understood that each modulator is provided with suitable filtering for this purpose.

It should be evident at this point that it is unnecessary to provide separate amplifiers in each section of the loop if sufficient gain to sustain oscillations can be realized with only one amplifier. In this latter case, it is sufficient to provide instead a wave circuit, such as a coaxial line or wave guide, whose electrical length will also vary with frequency so that the phase departure around the closed loop can be maintained at zero as the operating frequency varies.

It is generally characteristic of wave guides that the electrical length does not vary exactly linearly with frequency. Since it is then necessary to match this curved characteristic to the relatively straight characteristic of an element such as a traveling wave amplifier, in such cases it is desirable to keep the electrical lengths of each section as short as is convenient and to employ a frequency selective element of sharper response, i. e. a higher Q. Alternatively, if insufficient gain is realized with single stage amplifiers in each section of the loop, it is possible to provide plural stage amplifiers as the attenuation characteristics of the loop may require. In either case, the same general considerations are applicable. The electrical length-vs.-frequency characteristics of the two sections are adjusted so that, with change in the frequency of oscillation, increases in length of one section are matched by decreases in length of the other.

The various elements necessary to a frequency modulated oscillator of the kind described can take many forms. First, the principles of the invention are applicable generally to oscillators which incorporate amplifying elements of relatively long electrical length.

Typical amplifiers of this sort are the various forms of traveling wave tubes, magnetron amplifiers, and plural stream tubes. So many forms are now well known in the art that it appears unnecessary to elaborate further on this point.

It should also be evident that it is unnecessary that the two operating frequencies $f_1$ and $f_2$ be made to deviate equally in opposite directions in every case. The relative lengths of the two sections of the oscillatory loop can be adjusted so that for a change in the operating frequency $f_1$, zero phase departure around the loop can be maintained by changing the operating frequency either just a fraction or a number of times as much in the opposite direction. In general, it is useful to interconnect the various elements by sections of wave guides. By proper choice of cutoff frequencies for the various guides, some frequency discrimination can be effected. It is also important that the guide lengths of the two sections of the oscillatory loop be considered in compensating for changes in electrical length with varying operating frequencies.

For the case of wave guide interconnections, a variety of choices is possible for the frequency responsive element 15 whose attenuation and phase characteristics are to be controlled by modulating information.

Figure 3A:
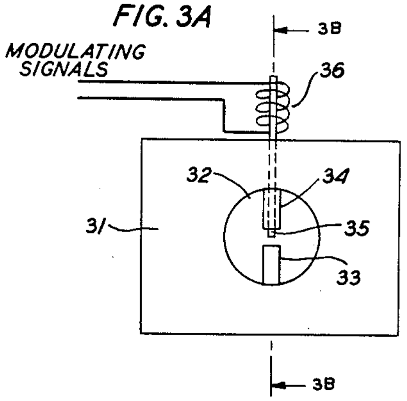
Figs. 3A and 3B show a resonant element suitable for incorporation in the embodiments of Figs. 1 and 6 when audio signals represent the modulating information.
Figure 3B:
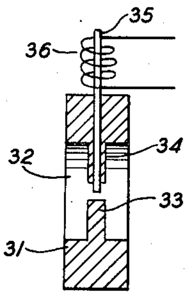

Figs. 3A and 3B are front and section views, respectively of such an element which is particularly suited to have its resonance frequency varied by audio signals. A conductive plate 31, apertured in the iris 32, is connected across the wave guide. Two conductive posts 33 and 34 extend into the iris to form of it a resonant circuit. Within the post 34 extends a conductive plunger 35 which varies up and down under the influence of magnetic fields set up in the surrounding inductive coil 36 by modulating signals supplied thereto. Plunger motion effects a change in the separation between the conductive posts 33 and 34 and hence the frequency of resonance of the iris.

For radio frequency modulating signals, it is advantageous to employ a resonant element whose resonance frequency can be varied electronically. Of this type is the resonant element shown in Figs. 4A and 4B, which utilizes the "hot capacitance" effect to vary the tuning frequency. In basic operation, it is analogous to the resonant iris previously described with reference to Figs. 3A and 3B. Two conductive plates 41 and 42 are spaced apart across the wave guide and each is similarly apertured to form the iris 43 therethrough. Supported from flanges in the plates 41 and 42 and extending across the iris is the tuning assembly 46 which varies the frequency of resonance of the iris in accordance with modulating radio frequency signals. The tuning assembly 46 comprises a space charge tube 45 about whose tubular glass envelope 47 fit two spaced cylindrical conductive shields 48 and 49, which are flush with the flanges in the plates 41 and 42. Inside the envelope are two cylindrical conductive shields 51 and 52, the first of which is capacitively coupled through the glass envelope to the upper outer shield 48 and the second is maintained at the D.-C. potential of the lower outer shield 49 and so remains at reference or wave guide D.-C. potential. Shield 52 is connected to the cathode 53 of the space charge device and shield 51 is connected to the control grid thereof. The anode 55 is supplied from a suitable anode voltage supply 56. The radio frequency modulating information is then applied as an input between the cathode 53 and control grid 54. Changes in the control grid cathode potential vary the space charge density in the grid-cathode region and hence the effective grid-cathode capacitance. This capacitance variation amounts to a capacitance variation between the outer shields 48 and 49, and accordingly, the tuning of the frequency of resonance of the iris in the wave guide.

Various modulators can be devised for use with wave guide interconnections for the practice of the invention. Fig. 5 shows in perspective a typical modulator for supplying the operating frequency $f_2$. The modulator comprises essentially a T section 60, of which the stem 61 is supplied with waves from the beating oscillator of reference frequency $f_0$, one arm 62 is supplied with waves of the operating frequency $f_1$, and from the other arm 63 is derived the difference frequency $f_0—f_1$ which serves as the operating frequency $f_2$. Enclosed within the T section 60, there is positioned a crystal element 64 which acts as a non-linear element for forming modulation products. Loading for the crystal element is provided by the shorted section of coaxial line 65 of length chosen to minimize the conversion loss of the crystal. The outer conductor of the coaxial line is maintained at the potential on the walls of the T section and the free end of the inner conductor is connected to one face of the crystal of which the opposite face is connected to a wall of the T. Suppression of undesired modulation products can be achieved by the insertion of suitable filter elements, for example, of the inductive post type, in the arm 63, although for simplicity these have not been shown here.

Moreover, it should be evident from reciprocity considerations that the identical modulator described above can be employed for the conversion of waves of frequency $f_2$ to waves of frequency $f_1$, merely by applying input waves of frequency $f_2$ into arm 63 and deriving output waves of frequency $f_1$ from the other arm 62.

Additionally, if desired the modulators can be made an active device for providing the loop gain necessary for sustaining oscillations without need for separate amplifying elements.

Fig. 6 shows an alternative arrangement of the invention which employs a single amplifying element, for example, a traveling wave tube, so that it is effectively in both sections of the oscillatory loop. The operation is similar to that for the arrangement shown in Fig. 1 except that the complete circuit of the oscillatory loop includes two traversals through the amplifier 72, each at a different operating frequency. The first section of the oscillatory loop includes essentially the frequency converter or modulator 71 supplying a wave of operating frequentcy $f_1$ the amplifying element 72 operating on the signal of frequency $f_1$ and the filter element 73 tuned to pass the frequency $f_1$; the second section includes essentially the modulator 74 supplied with inputs of operating frequency $f_1$ for providing a wave of operating frequency $f_2$, the amplifying element 72 this time operating on the signal of frequency $f_2$, and the resonant element 75 whose resonant frequency is varied by the modulating information. A beating oscillator 76 of fixed frequency $f_0$ supplies input waves to each of the modulators 71 and 74. The frequency assignments are the same as in the arrangement of Fig. 1, the reference frequency $f_0$ being the sum of frequencies $f_1$ and $f_2$. For utilization, the output, which is here that of frequency $f_2$, is derived from one arm of a hybrid junction 77 in the $f_2$ section of the oscillatory loop. This arrangement employs to advantage the broad band characteristics of such amplifiers as traveling wave amplifiers for simultaneous amplification of the two distinct $f_1$ and $f_2$ frequency bands. Discrimination is thereafter effected by appropriate filtering in the two sections of the oscillatory loop. For use as the resonant and modulator elements, those described in Figs. 3, 4 and 5 are here suitable too.

Reference should be made to U. S. patent applications Serial Nos. 351,945 and 351,946, filed April 29, 1953, which are divisional applications of the present application, for claims directed to material disclosed but not claimed herein.

It is to be understood that the above-described arrangements are merely illustrative of the general principles of the invention. Various other embodiments can be devised by one skilled in the art without departing from the spirit and scope of the invention.

What is claimed is:

1. In an oscillator, an oscillatory loop comprising two wave transmission sections, each a plurality of wavelengths long, the first operating at a first frequency, the second at a second frequency, phase shifting means controlling the first frequency, frequency converting means for effecting changes in the second frequency opposite to changes in the first frequency, and means serially connected in said oscillatory loop for providing gain for sustaining oscillations.

2. In an oscillator, an oscillatory loop comprising two wave transmission sections, each a plurality of wavelengths long, the first operating at a first frequency, the second at a second frequency, a resonant element modulated by signal information for varying the first frequency, frequency converting means for varying the second frequency oppositely to changes in the first frequency, and means serially connected in said oscillatory loop for providing gain for sustaining oscillations.

3. An oscillator comprising a loop oscillatory circuit including first and second frequency modulators for providing signals of first and second frequencies, respectively, the first modulator supplied with an input of the second frequency, and the second modulator with an input of the first frequency, the sum of said first and second frequencies remaining constant, wave circuit means, a plurality of wavelengths long, inserted in the signal paths between the first and second modulators, means serially connected in said oscillatory loop for providing gain for sustaining oscillations, and phase shifting means coupled to one of said frequency modulators.

4. In a frequency modulator, a source of modulating information, a source of a reference frequency, and a loop oscillatory circuit including first and second frequency modulators for providing signals of first and second varying frequencies, respectively, each supplied from the source of reference frequency, the sum of the first and second frequencies remaining equal to the reference frequency, wave transmission means, a plurality of wavelengths long, inserted in the signal paths between the first and second modulators, amplifying means serially connected in said oscillatory circuit, and phase shifting means varied by said modulating information coupled to one of said frequency modulators.

5. An oscillator comprising a source of modulating information, a source of reference frequency, and a loop oscillatory circuit including first and second frequency converters, each supplied from said source of reference frequency for providing signals of varying first and second frequencies, the sum of the first and second frequencies being equal to the reference frequency, wave circuit means, a plurality of wavelengths long, inserted in the signal paths between the first and second frequency converters, amplifying means serially connected in said oscillatory loop for providing a loop gain for sustaining oscillations, and resonant means whose resonant frequency is varied by said modulating information coupled to one of said frequency converters.

6. In an oscillator, modulating means, a source of reference frequency and an oscillatory circuit comprising first and second sections connected in a closed loop, each including a modulator supplied from said source of reference frequency and a signal path element, a plurality of wavelengths long, the first and second sections operating at first and second varying frequencies, respectively, the sum of the first and second frequencies being equal to the reference frequency, amplifying means serially connected in said closed loop for providing a loop gain for sustaining oscillations, and variable phase shifting means controlled by said modulating means coupled to one of said sections.

7. In a frequency modulated oscillator, a source of modulating information, a source of reference frequency, and an oscillatory circuit comprising first and second sections connected in a closed loop, each including frequency converting means supplied from the source of reference frequency and wave transmission means forming a signal path a plurality of wavelengths long, the frequency converting means in said first and second sections providing first and second varying frequencies, respectively, the sum of the first and second frequencies being equal to the reference frequency, amplifying means for sustaining oscillations, and resonant means whose resonant frequency is varied by the modulating information coupled to said closed loop.

8. An oscillator comprising a source of reference frequency and an oscillatory circuit including two sections in a closed loop, each including a modulator supplied with an input of reference frequency and an amplifier characterized by a signal path a plurality of wavelengths long, the first and second amplifiers supplied with inputs of first and second different frequencies, respectively, the sum of the first and second frequencies being equal to the reference frequency, and variable phase shifting means serially connected in said closed loop for varying the first and second frequencies.

9. An oscillator comprising a source of modulating information, a source of reference frequency, and an oscillatory circuit including two sections in a closed loop, each including frequency converting means supplied with inputs of reference frequency and an amplifier characterized by a signal path a plurality of wavelengths long, the first and second amplifiers supplied with inputs of first and second different frequencies, respectively, from the associated first and second frequency converting means, the sum of the first and second frequencies being equal to the reference frequency, and resonant means serially connected in said closed loop whose resonant frequency is changed by the modulating information for varying the first and second frequencies.

10. In an oscillator, a source of reference frequency, an amplifier, first and second frequency converters supplying outputs of first and second frequencies, respectively, each supplied with inputs of reference frequency, and the first converter further supplied with an input of the second frequency, and the second converter supplied with an input of the first frequency, whereby the sum of the first and second frequencies is equal to the reference frequency, variable phase shifting means connected in a closed loop connection with the first frequency converter and the amplifier, and frequency selective means connected in a closed loop connection with the second frequency converter and the amplifier.

11. In an oscillator, amplifying means characterized by a transmission path a plurality of wavelengths long, a first transmission loop including the wave amplifying means, first frequency converting means producing outputs of first frequency and variable phase shifting means, a second transmission loop including the wave amplifying means, second frequency converting means producing outputs of second frequency, and frequency selective means, a source of reference frequency supplying inputs to each of said first and second frequency converting means, said reference frequency being the sum of said first and second frequencies.

References Cited in the file of this patent

UNITED STATES PATENTS

| | | |
|---|---|---|
| 2,289,041 | Roberts | July 7, 1942 |
| 2,416,080 | Bailey | Feb. 18, 1947 |
| 2,418,518 | McArthur | Apr. 8, 1947 |
| 2,422,189 | Fiske | June 17, 1947 |
| 2,447,543 | Smullin | Aug. 24, 1948 |
| 2,489,855 | Brown | Nov. 29, 1949 |
| 2,549,775 | Charchian et al. | Apr. 24, 1951 |
| 2,577,118 | Fiske | Dec. 4, 1951 |
| 2,593,113 | Cutler | Apr. 15, 1952 |
| 2,624,041 | Evans | Dec. 30, 1952 |